United States Patent
Hayashi et al.

(10) Patent No.: US 9,453,144 B2
(45) Date of Patent: Sep. 27, 2016

(54) RADICAL POLYMERIZABLE ADHESIVE COMPOSITION AND METHOD OF PRODUCING ELECTRICAL CONNECTION BODY

(71) Applicant: DEXERIALS CORPORATION, Tokyo (JP)

(72) Inventors: Shinichi Hayashi, Utsunomiya (JP); Yuji Tanaka, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/892,095

(22) PCT Filed: Jul. 15, 2014

(86) PCT No.: PCT/JP2014/068781
§ 371 (c)(1),
(2) Date: Nov. 18, 2015

(87) PCT Pub. No.: WO2015/029622
PCT Pub. Date: Mar. 5, 2015

(65) Prior Publication Data
US 2016/0115354 A1  Apr. 28, 2016

(30) Foreign Application Priority Data
Aug. 30, 2013  (JP) ................ 2013-180751

(51) Int. Cl.
| | | |
|---|---|---|
| C09J 4/00 | (2006.01) | |
| C09J 4/06 | (2006.01) | |
| C08F 2/50 | (2006.01) | |
| H01L 23/00 | (2006.01) | |
| C09J 5/00 | (2006.01) | |
| C09J 5/06 | (2006.01) | |
| C08F 220/18 | (2006.01) | |
| C08F 222/10 | (2006.01) | |

(52) U.S. Cl.
CPC .. *C09J 4/06* (2013.01); *C08F 2/50* (2013.01); *C09J 4/00* (2013.01); *C09J 5/00* (2013.01); *C09J 5/06* (2013.01); *H01L 24/29* (2013.01); *C08F 220/18* (2013.01); *C08F 222/1006* (2013.01); *C09J 2205/31* (2013.01); *C09J 2433/00* (2013.01); *C09J 2471/00* (2013.01); *H01L 24/83* (2013.01); *H01L 2224/16227* (2013.01); *H01L 2224/2919* (2013.01); *H01L 2224/32225* (2013.01); *H01L 2224/73204* (2013.01); *H01L 2224/83203* (2013.01); *H01L 2224/83874* (2013.01); *H01L 2924/181* (2013.01)

(58) Field of Classification Search
CPC ................ C09J 4/00; C09J 4/06; C09J 5/06; C09J 5/00; C09J 2205/31; C08F 2/50; H01L 24/29; B29C 65/14
See application file for complete search history.

(56) References Cited

FOREIGN PATENT DOCUMENTS

| | | |
|---|---|---|
| JP | 2002-235065 A | 8/2002 |
| JP | 4469089 B2 | 5/2010 |
| JP | 2012-107194 A | 6/2012 |
| JP | 2012-126879 A | 7/2012 |
| WO | 2012/017955 A1 | 2/2012 |

OTHER PUBLICATIONS

Oct. 7, 2014 Search Report issued in International Patent Application No. PCT/JP2014/068781.

*Primary Examiner* — Daniel McNally
(74) *Attorney, Agent, or Firm* — Oliff PLC

(57) ABSTRACT

A radical polymerizable adhesive composition contains a radical polymerizable compound, a thermal-radical polymerization initiator, and a photoacid generator, but contains no cationic polymerizable compound that undergoes cationic polymerization initiated by an acid generated by the photoacid generator. The photoacid generator has the property of accelerating the thermal-radical polymerization reaction of the radical polymerizable adhesive composition. The thermal-radical polymerization initiator is an organic peroxide, and the photoacid generator is a sulfonium salt, an iodonium salt, or an iron-arene complex.

10 Claims, No Drawings

RADICAL POLYMERIZABLE ADHESIVE COMPOSITION AND METHOD OF PRODUCING ELECTRICAL CONNECTION BODY

TECHNICAL FIELD

The present invention relates to a radical polymerizable adhesive composition containing a radical polymerizable compound, a thermal-radical polymerization initiator, and a photoacid generator.

BACKGROUND ART

An electrical connection body is produced widely by laminating an electrical component such as a liquid crystal panel or an organic EL panel and another electrical component such as an IC chip or a flexible circuit board through an uncured adhesive layer formed from a curable adhesive composition and then curing the uncured adhesive layer to form a cured adhesive layer. In this case, when heating performed to cure the uncured adhesive layer is excessive, warpage may occur in the electrical connection body, or the electrical components may be damaged. Therefore, a photocationic polymerizable adhesive composition containing a cationic polymerizable compound such as an epoxy compound and a photoacid generator added as a photocationic polymerization initiator has been used as the curable adhesive composition.

However, when a light-shielding portion such as a metal trace is present in any of the electrical components, the uncured adhesive layer is not irradiated sufficiently with light because of the presence of the light-shielding portion, and this causes a problem in that the die shear strength of the joint portion becomes low. One proposal to address this problem is to add a thermal-radical polymerizable compound such as an acrylate-based monomer or oligomer and a thermal-radical polymerization initiator such as an organic peroxide to the photocationic polymerizable adhesive composition in order to impart thermal curability thereto (Patent Literature 1).

CITATION LIST

Patent Literature

Patent Literature 1: Japanese Patent No. 4469089

SUMMARY OF INVENTION

Technical Problem

The temperature of heating during the operation of thermocompression bonding for conductive connection using the curable adhesive composition disclosed in Patent Literature 1 is generally 130 to 180° C. so that the electrical connection body produced using the curable adhesive composition exhibits a low conductive resistance value and favorable die shear strength.

However, a problem with the thermocompression bonding treatment performed at the above temperature is that practically non-negligible warpage occurs in the electrical connection body. Therefore, it is contemplated to lower the heating temperature to about 100° C. However, in this case, the thermal curing reaction is insufficient, so that the light-shielding portion of the adhesive layer is cured insufficiently. This may cause an increase in conductive resistance value or a reduction in die shear strength.

An object of the present invention is to solve the problems in the prior art. When an electrical connection body is produced, an electrical component such as a liquid crystal panel or an organic EL panel and another electrical component such as an IC chip or a flexible circuit board are laminated through an uncured adhesive layer formed of a curable adhesive composition, and then the uncured adhesive layer is cured to form a cured adhesive layer. In this case, an object of the invention is to prevent practically non-negligible warpage from occurring in the electrical connection body and to allow the electrical connection body to have sufficient die shear strength and a low conductive resistance value even when a light-shielding portion such as a metal trace is present in any of the electrical components to be joined to each other.

Solution to Problem

A photoacid generator serving as a photocationic polymerization initiator is always used together with a cationic polymerizable compound. However, the present inventors have removed, from a polymerizable composition containing a radical polymerizable compound, a thermal-radical polymerization initiator, a cationic polymerizable compound, and a photoacid generator, the cationic polymerizable compound. Then the inventors have unexpectedly found that the radical polymerization reaction of the composition obtained by removing the cationic polymerizable compound from the polymerizable composition (but containing the photoacid generator) is accelerated as compared to the radical polymerization reaction of a composition obtained by removing not only the cationic polymerizable compound but also the photoacid generator from the polymerizable composition. Thus, the present invention has been completed.

Accordingly, the present invention provides a radical polymerizable adhesive composition containing a radical polymerizable compound, a thermal-radical polymerization initiator, and a photoacid generator, but containing no cationic polymerizable compound that undergoes cationic polymerization initiated by an acid generated by the photoacid generator.

The present invention also provides a method of producing an electrical connection body. The method comprises the steps of:

disposing an adhesive layer on a terminal of one of two electrical components to be opposed to each other;

disposing a terminal of another one of the two electrical components on the adhesive layer; and curing the adhesive layer by heating the adhesive layer and irradiating the adhesive layer with light while the one of the two electrical components opposed to each other is pressed against the other one of the two electrical components, whereby the two electrical components opposed to each other are electrically connected to each other, wherein the adhesive layer is formed from the radical polymerizable adhesive composition described above, and wherein, when the adhesive layer is cured, irradiation with the light causes the photoacid generator to generate an acid to thereby accelerate a thermal-radical polymerization reaction of the radical polymerizable adhesive composition, whereby the adhesive layer is cured.

The present invention further provides a method of producing an electrical connection body. The method comprises the steps of:

disposing an adhesive layer on a terminal of one of two electrical components to be opposed to each other;

disposing a terminal of another one of the two electrical components on the adhesive layer; and curing the adhesive layer by heating the adhesive layer and irradiating the adhesive layer with light while the one of the two electrical components opposed to each other is pressed against the other one of the two electrical components, whereby the two electrical components opposed to each other are electrically connected, wherein the adhesive layer is formed from the radical polymerizable adhesive composition described above, and the adhesive layer is heated at a temperature lower than a thermal-radical polymerization reaction temperature of a control radical polymerizable composition that corresponds to a composition obtained by removing the photoacid generator from the radical polymerizable adhesive composition.

Advantageous Effects of Invention

The radical polymerizable adhesive composition of the present invention contains the radical-polymerizable compound, the thermal-radical polymerization initiator, and the photoacid generator and contains no cationic polymerizable compound that undergoes cationic polymerization initiated by an acid generated by the photoacid generator. Therefore, the acid generated by the photoacid generator under irradiation with light is not consumed by the cationic polymerization of the cationic polymerizable compound, so that the thermal-radical polymerization reaction of the radical polymerizable adhesive composition can be accelerated. More specifically, the thermal-radical polymerization reaction of the radical polymerizable adhesive composition can be accelerated as compared to the thermal-radical polymerization reaction of a control radical polymerizable composition corresponding to a composition obtained by removing the photoacid generator from the radical polymerizable adhesive composition (the control composition corresponds to compositions in Comparative Examples 2 and 3 described later). This may be because the acid generated by the photoacid generator under irradiation with light accelerates the decomposition of the thermal-radical polymerization initiator.

DESCRIPTION OF EMBODIMENTS

<<Radical Polymerizable Adhesive Composition>>

The radical polymerizable adhesive composition of the present invention contains a radical polymerizable compound, a thermal-radical polymerization initiator, and a photoacid generator and contains no cationic polymerizable compound that undergoes cationic polymerization initiated by an acid generated by the photoacid generator, more specifically contains no epoxy compound, no oxetane compound, and no vinyl ether compound.

<Radical Polymerizable Compound>

The radical polymerizable compound constituting the radical polymerizable adhesive composition of the present invention is a compound that can undergo a radical polymerization reaction initiated by active radicals generated by the thermal decomposition of the thermal-radical polymerization initiator. Preferably, the radical polymerizable compound has one or more unsaturated carbon bonds in its molecule, and the compound is intended to encompass a so-called monofunctional radical polymerizable compound and a so-called polyfunctional radical polymerizable compound. When the radical polymerizable compound contains a polyfunctional radical polymerizable compound, the die shear strength of the cured product of the radical polymerizable adhesive composition can be further improved. Therefore, the radical polymerizable compound contains the polyfunctional radical polymerizable compound in an amount of at least 30% by mass or more, and more preferably at least 50% by mass or more.

Examples of the monofunctional radical polymerizable compound may include: monofunctional vinyl-based compounds such as styrene and methylstyrene; and monofunctional (meth)acrylate-based compounds such as butyl acrylate and butyl methacrylate. The term "(meth)acrylate" is intended to encompass acrylate and methacrylate. Examples of the polyfunctional radical polymerizable compound may include: polyfunctional vinyl-based compounds such as divinylbenzene; and polyfunctional (meth)acrylate-based compounds such as 1,6-hexanediol diacrylate, trimethylolpropane trimethacrylate, bisphenol A type glycidyl methacrylate (EA-1020, Shin Nakamura Chemical Co., Ltd.), and isocyanuric acid EO modified diacrylate (M-215, Toagosei Co., Ltd.). These may be monomers or may be oligomers. Of these, in terms of heat resistance, polyfunctional (meth)acrylate-based compounds, particularly, bisphenol A type glycidyl methacrylate and isocyanuric acid EO modified diacrylate, are preferred.

The polyfunctional radical polymerizable compound may be composed of a polyfunctional vinyl-based compound and a polyfunctional (meth)acrylate-based compound. The combined use of these compounds allows control of thermal responsiveness and allows introduction of a reactive functional group.

<Thermal-Radical Polymerization Initiator>

The thermal-radical polymerization initiator constituting the radical polymerizable adhesive composition of the present invention thermally decomposes and thereby generates active radicals used for radical polymerization of the radical polymerizable compound, and any known thermal-radical polymerization initiator such as an organic peroxide or an azo-based compound can be preferably used. Particularly, an organic peroxide can be preferably used because excellent storage stability and low-temperature fast curability can be achieved.

Examples of the organic peroxide may include known organic peroxides used as thermal-radical polymerization initiators, such as diacyl peroxides, peroxydicarbonates, peroxyesters, peroxyketals, dialkyl peroxides, hydroperoxides, and silyl peroxides, which are classified by their chemical structure. Of these, peroxyesters and diacyl peroxides can be preferably used because the amount of organic acid generated by thermal decomposition is small. In terms of reactivity, organic peroxides having a one-minute half-life temperature of 80 to 170° C. are preferred, and organic peroxides having a molecular weight of 180 to 1,000 are preferred.

The azo-based compound used may be any azo-based compound publicly known as a thermal-radical polymerization initiator.

The amount of the thermal-radical polymerization initiator in the radical polymerizable adhesive composition is preferably 0.5 to 30 parts by mass relative to 100 parts by mass of the radical polymerizable compound, and more preferably 1.0 to 20 parts by mass, in order to allow the radical polymerizable adhesive composition to cure sufficiently and in order not to cause foaming.

<Photoacid Generator>

The photoacid generator constituting the radical polymerizable adhesive composition of the present invention generates an acid when irradiated with light such as ultraviolet rays to accelerate the decomposition of the thermal-radical polymerization initiator. In other words, the photoacid generator has the property of accelerating the thermal-radical polymerization reaction of the radical polymerizable adhesive composition. More specifically, the photoacid generator can accelerate the thermal-radical polymerization reaction of the radical polymerizable adhesive composition as compared to the thermal-radical polymerization reaction of a control radical polymerizable composition corresponding to a composition obtained by removing the photoacid generator from the radical polymerizable adhesive composition.

Therefore, the thermal-radical polymerization reaction temperature $T_1$ of the radical polymerizable adhesive composition containing the photoacid generator is lower than the thermal-radical polymerization reaction temperature $T_0$ of the control radical polymerizable composition containing no photoacid generator. The thermal-radical polymerization reaction temperature is the reaction temperature necessary to allow the polymerized product to exhibit prescribed characteristics and is the polymerization reaction temperature that is set according to the types of components of the polymerization system, the ratio of these components, the prescribed characteristics, etc.

In the present invention, the thermal-radical polymerization reaction temperature $T_0$ of the control radical polymerizable composition containing no photoacid generator is within the range of preferably 100 to 130° C. Preferably, the thermal-radical polymerization reaction temperature $T_1$ of the radical polymerizable adhesive composition containing the photoacid generator is lower by at least 10° C. than $T_0$.

The photoacid generator described above can be appropriately selected from photoacid generators used as photocationic polymerization initiators. Examples of such photoacid generators may include: onium salts such as aromatic diazonium salts; sulfonium salts such as aromatic sulfonium salts and aliphatic sulfonium salts; pyridinium salts; selenonium salts; iodonium salts such as aromatic iodonium salts; complex compounds including metal-arene complexes such as iron-arene complexes; and tosylate compounds such as benzoin tosylate and o-nitrobenzyl tosylate. Of these, sulfonium salts, iodonium salts, and iron-arene complexes are preferred because efficiency of generation of cationic species can be improved. Particularly, aromatic sulfonium salts, specifically triarylsulfonium salts, which react highly sensitively with light, i.e., an I-line (365 nm) from an LED light source, are preferred.

When the photoacid generator is a salt, hexafluoroborate, hexafluorophosphate, tetrafluoroborate, tetrakis(pentafluorophenyl)borate, etc. can be used preferably as the counter anion of the salt, from the viewpoint of improving reactivity. Of these, tetrakis(pentafluorophenyl)borate can be used preferably.

The amount of the photoacid generator added to the radical polymerizable adhesive composition is preferably 1.0 to 30 parts by mass relative to 100 parts by mass of the thermal-radical polymerization initiator, and more preferably 2 to 20 parts by mass. When the amount is within this range, the effect of accelerating the decomposition of the thermal-radical polymerization initiator can be obtained.

<Additional Components>

The radical polymerizable adhesive composition of the present invention may further contain a thermoplastic resin such as a phenoxy resin as a film-forming resin. The amount of the thermoplastic resin added is preferably 10 to 70 parts by mass relative to 100 parts by mass of the radical polymerizable compound, and more preferably 20 to 60 parts by mass.

The radical polymerizable adhesive composition of the present invention may further contain any known silane coupling agent. The amount of the silane coupling agent added is preferably 0.1 to 20 parts by mass relative to 100 parts by mass of the radical polymerizable compound, and more preferably 0.5 to 10 parts by mass. When the amount of the silane coupling agent is within the above range, the effect of improving adhesion to inorganic and metal-based materials can be obtained.

If necessary, the radical polymerizable adhesive composition of the present invention may further contain any known photoradical polymerization initiator, an inorganic filler, an organic filler, a conductive filler, an insulating filler, etc.

<Preparation of Radical Polymerizable Adhesive Composition>

The radical polymerizable adhesive composition of the present invention can be prepared by uniformly mixing the radical polymerizable compound, the thermal-radical polymerization initiator, the photoacid generator, and additional components such as the thermoplastic resin added as needed, using known mixing means.

<<Method of Producing Electrical Connection Body: 1>>

The method (1) of producing an electrical connection body according to the present invention includes the following steps (A) to (C). These steps will be described one by one.

<Step (A)>

An adhesive layer is disposed on a terminal of one of two electrical components to be opposed to each other using any known method. Examples of the one of the two electrical components to be opposed to each other may include rigid circuit boards and flexible circuit boards. Examples of the terminals of these electrical components may include pad electrodes, line electrodes, bump electrodes, etc. formed from electrode materials such as copper, aluminum, silver, gold, and ITO. The adhesive layer is formed from the above-described radical polymerizable adhesive composition of the present invention. The adhesive layer can be formed using a known method such as any of various coating methods and printing methods, photolithography, etc.

<Step (B)>

Next, a terminal of another one of the electrical components is disposed on the adhesive layer formed in step (A) using any known method. Examples of the other electrical component may include IC chips, liquid crystal panels, organic EL panels, IC modules, and solar cell modules. Examples of the terminals of these electrical components may include pad electrodes, line electrodes, bump electrodes, etc. formed of electrode materials such as copper, aluminum, silver, gold, and ITO.

<Step (C)>

The adhesive layer is heated while one of the two electrical components opposed to each other in step (B) is pressed against another one using any known thermocompression tool. At the same time as the heating or after the composition is softened or melted, preferably 2 or 3 seconds after the start of the heating while the heating is continued, the adhesive layer is irradiated with light such as ultraviolet rays, preferably an I-line from an LED light source, to cure the adhesive layer. When at least one of the electrical components is a component in which a metal terminal that can serve as a light-shielding portion is formed on one side of a transparent substrate, it is preferable that the adhesive layer be irradiated with light from the other side of the transparent substrate of the electrical component. By curing the adhesive layer in the manner described above, an electrical connection body can be obtained. In this case, the irradiation with light causes the photoacid generator to generate an acid. The thermal-radical polymerization of the radical polymerizable adhesive composition is thereby accelerated as compared to the thermal-radical polymerization of the control radical polymerizable composition corresponding to a composition obtained by removing the photoacid generator from the radical polymerizable adhesive composition, whereby the adhesive layer is cured. In this manner, the adhesive layer can be cured sufficiently even when the light-shielding portion is present, and the two electrical components opposed to each other can be connected to each other at a low conduction resistance value. In addition, favorable die shear strength can be achieved, and the occurrence of warpage in the electrical connection body can be suppressed.

<<Method of Producing Electrical Connection Body: 2>>

The method (2) of producing an electrical connection body according to the present invention includes the same steps as steps (A) to (C) in the production method (1). However, the production method (2) is different from the production method (1) in that, in step (C), a specific heating condition is specified, i.e., the adhesive layer is heated at a temperature lower than the thermal-radical polymerization reaction temperature of the control radical polymerizable composition corresponding to a composition obtained by removing the photoacid generator from the radical polymerizable adhesive composition. Since the heating and curing is performed at a temperature lower than the thermal-radical polymerization reaction temperature $T_0$, the occurrence of warpage of the electrical connection body can be suppressed. In addition, the acid generated by the photoacid generator allows the thermal-radical polymerization reaction temperature $T_1$ of the radical polymerizable adhesive composition to be lower than To, so that the adhesive layer can be cured sufficiently. In this manner, the two electrical component opposed to each other can be connected to each other at a low conductive resistance value. In addition, favorable die shear strength can be achieved, and the occurrence of warpage in the electrical connection body can be suppressed.

EXAMPLES

The present invention will next be described more specifically by way of Examples.

Examples 1 to 10 and Comparative Examples 1 to 5

Components of one of chemical compositions shown in TABLE 1 were mixed by a routine method to obtain a mixture (an adhesive composition), and the mixture was applied to a polyester release film and dried at 70° C. to thereby obtain a 20 μm-thick adhesive sheet.

<Production of Electrical Connection Bodies for Conductive Resistance Measurement, Die Shear Strength Measurement, and Warpage Amount Measurement>

One of the obtained adhesive sheets was held between an IC (outer dimensions: 1.8 mm×20 mm, bump height: 15 μm) used as an evaluation substrate and ITO-coated glass (glass thickness: 0.5 mm, ITO thickness: 200 nm) used as a base glass substrate having, on the rear side, aluminum line electrodes (light-shielding portions) having a width of 200 μm and a thickness of 500 nm and arranged at a pitch of 200 μm. Then the IC was heated and pressurized under the conditions of a heating temperature in TABLE 1 and a pressure of 80 MPa for 5 seconds. Two seconds after the start of heating, UV irradiation was performed for 3 seconds from the rear side of the glass substrate (the side on which the aluminum line electrodes were formed) under the UV irradiation condition in TABLE 1 (UV light source: UV irradiator ZUV-C30H (OMRON Corporation) to thereby produce an electrical connection body for test evaluation.

<Measurement of Conductive Resistance Value of Electrical Connection Body>

The conductive resistance value of each of the produced electrical connection bodies when a current of 2 mA was supplied thereto was measured by a four-terminal method using a resistance meter (digital multi-meter 7555, Yokogawa Electric Corporation). The results obtained are shown in TABLE 1. Practically, the conductive resistance value is desirably 1.0Ω or less.

<Measurement of Die Shear Strength of Electrical Connection Body>

The die shear strength of each of the produced electrical connection bodies was measured under the condition of a tool speed of 100 μm/second using a die shear tester (Multipurpose Bondtester 4000 series, DAGE Japan). The results obtained are shown in TABLE 1. Practically, the die shear strength is desirably 100 kgf or more.

<Measurement of Amount of Warpage of Electrical Connection Body>

For each of the produced electrical connection bodies, the surface of the glass substrate on which the aluminum line electrodes were formed was scanned with a probe of a stylus type surface roughness meter (SE-3H, Kosaka Laboratory Ltd.) to measure the amount of warpage (μm). The results obtained are shown in TABLE 1. Practically, the amount of warpage is desirably 10 μm or less.

TABLE 1

| | | Example | | | | | | | | | | Comparative Example | | | | |
|---|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 | 5 |
| Amount Added | Phenoxy Resin (YP-50, Nippon Steel & Sumikin Chemical Co., Ltd.) | 45 | 45 | 45 | 45 | 45 | 45 | 45 | 45 | 45 | 45 | 45 | 45 | 45 | 45 | 45 |
| | Epoxy Acrylate (Bis AType) (EA-1020, Shin Nakamura Chemical Co., Ltd.) | 45 | 45 | 45 | 45 | 45 | 45 | 45 | 45 | 45 | | 45 | 45 | 45 | 45 | 15 |
| | IsocyanuricAcid EO Modified Diacrylate (M-215, Toagosei Co., Ltd.) | | | | | | | | | | 45 | | | | | |
| | Silane Coupling Agent (KBM-403, Shin-Etsu Chemical Co., Ltd.) | 2 | 2 | 2 | 2 | 2 | 2 | 2 | 2 | 2 | 2 | 2 | 2 | 2 | 2 | 2 |

TABLE 1-continued

|  | Example | | | | | | | | | | Comparative Example | | | | |
|---|---|---|---|---|---|---|---|---|---|---|---|---|---|---|---|
|  | 1 | 2 | 3 | 4 | 5 | 6 | 7 | 8 | 9 | 10 | 1 | 2 | 3 | 4 | 5 |
| Epoxy Resin (EP-828, Mitsubishi Chemical Corp.) | | | | | | | | | | | | | | | 30 |
| Photoacid Generator (Irgacure 270, BASF Japan Ltd.) | 4 | 4 | 3 | | 4 | | 1 | 2 | 3 | 4 | 8 | | | | 4 |
| Photoacid Generator (CPI-101A, San-Apro Ltd.) | | | | 4 | | 4 | | | | | | | | | |
| Organic Peroxide (Nyper BW, NOF Corp.) | 4 | 4 | 3 | 4 | | | 7 | 6 | 5 | 4 | | 8 | 8 | | 4 |
| Organic Peroxide (Perhexa 250, NOF Corp.) | | | | | 4 | 4 | | | | | | | | | |
| Photo Radical Generator (Irgacure 369, BASF Japan Ltd.) | | 2 | | | | | | | | | | | | 8 | |
| Illuminance During Compression Bonding (mW/cm$^2$) | 50 | 50 | 50 | 50 | 50 | 50 | 50 | 50 | 50 | 50 | 50 | 50 | 50 | 50 | 50 |
| Compression Bonding Temperature (° C.) | 100 | 90 | 100 | 100 | 100 | 100 | 100 | 100 | 100 | 100 | 100 | 100 | 160 | 100 | 100 |
| Conductive Resistance (Ω) | 0.2 | 0.2 | 0.2 | 0.2 | 0.2 | 0.2 | 0.2 | 0.2 | 0.2 | 0.2 | >10 | >10 | 0.2 | 0.2 | 1.5 |
| Die Shear Strength (kgf) | 123 | 124 | 125 | 122 | 128 | 124 | 119 | 120 | 122 | 131 | 10> | 10> | 85 | 79 | 69 |
| Amount of Warpage (μm) | 8.8 | 7.9 | 9.0 | 8.8 | 8.9 | 9.1 | 8.7 | 9.0 | 8.8 | 8.7 | — | — | 16.1 | 9.0 | — |

<Discussion on Results in Table 1>

The radical polymerizable adhesive composition in Comparative Example 1 that contains a radical polymerizable compound contains a photoacid generator but contains no organic peroxide (no thermal-radical polymerization initiator). Therefore, no radical reaction (no curing reaction) proceeded, so that the conductive resistance value was very high and the die shear strength was very low.

The adhesive composition in Comparative Example 2 that contains a radical polymerizable compound contains an organic peroxide but contains no photoacid generator. In this case, the reaction starting temperature of the adhesive composition may not be lowered. Therefore, the radical reaction (curing reaction) did not proceed sufficiently under the heating condition of 100° C., so that the conductive resistance value was very high and the die shear strength was very low.

The adhesive composition in Comparative Example 3 that contains a radical polymerizable compound contains an organic peroxide but contains no photoacid generator. In this case, the reaction starting temperature of the adhesive composition may not be lowered. Therefore, the radical reaction (curing reaction) proceeded appropriately only when the heating condition was increased to 160° C. In this case, although the conductive resistance value was at a practical level, the die shear strength was insufficient. In addition, since the heating temperature was excessively high, non-negligible warpage occurred in the electrical connection body.

The adhesive composition in Comparative Example 4 that contains a radical polymerizable compound contains a photoradical polymerization initiator but contains no photoacid generator and no organic peroxide. In this case, photoradical polymerization proceeded. However, in the light-shielding portions of the adhesive layer, the photoradical polymerization did not proceed. Therefore, although the conductive resistance value and the amount of warpage were at practical levels, the die shear strength was insufficient.

The adhesive composition in Comparative Example 5 that contains a radical polymerizable compound contains an organic peroxide and also a photoacid generator and further contains an epoxy resin as a cationic polymerizable compound. In this case, the photoacid generator was consumed by cationic polymerization of the epoxy resin and could not sufficiently contribute to acceleration of the decomposition of the organic peroxide, so that the reaction starting temperature of the adhesive composition could not be lowered. Therefore, the radical reaction (curing reaction) did not proceed under the heating condition of 100° C., so that the conductive resistance value was very high and the die shear strength was very low.

On the contrary, each of the adhesive compositions in Examples 1 to 10 that contains a radical polymerizable compound contains an organic peroxide and also a photoacid generator but contains no epoxy resin as a cationic polymerizable compound. Therefore, the radical reaction (curing reaction) proceeded sufficiently even under the heating condition of 100° C. or 90° C., so that all the conductive resistance value, the die shear strength, and the amount of warpage were at practical levels.

INDUSTRIAL APPLICABILITY

The radical polymerizable adhesive composition of the present invention contains a radical polymerizable compound, a thermal-radical polymerization initiator, and a photoacid generator and contains no cationic polymerizable compound that undergoes cationic polymerization initiated by an acid generated by the photoacid generator. In this case, the thermal-radical polymerization reaction temperature of the radical polymerizable adhesive composition is lower than the thermal-radical polymerization reaction temperature of the control radical polymerizable composition corresponding to a composition obtained by removing the photoacid generator from the radical polymerizable adhesive composition. Therefore, the radical polymerizable adhesive composition of the present invention is useful for achieving a low conductive resistance value, favorable die shear strength, and a small amount of warpage when electrical components with a light-shielding portion present in their joint portion are connected to each other to produce an electrical connection body.

The invention claimed is:

1. A radical polymerizable adhesive composition comprising a radical polymerizable compound, a thermal-radical polymerization initiator, and a photoacid generator, but comprising no cationic polymerizable compound that undergoes cationic polymerization initiated by an acid generated by the photoacid generator.

2. The radical polymerizable adhesive composition according to claim 1, wherein the thermal-radical polymerization initiator is an organic peroxide, and the photoacid generator is a sulfonium salt, an iodonium salt, or an iron-arene complex.

3. The radical polymerizable adhesive composition according to claim 2, wherein the organic peroxide serving as the thermal-radical polymerization initiator is a peroxyester or a diacyl peroxide having a one-minute half-life temperature of 80 to 170° C. and a molecular weight of 180 to 1,000, and the photoacid generator is a triarylsulfonium salt.

4. The radical polymerizable adhesive composition according to claim 1, wherein the photoacid generator has a property of accelerating the thermal-radical polymerization reaction of the radical polymerizable adhesive composition.

5. A method of producing an electrical connection body, the production method comprising the steps of:
disposing an adhesive layer on a terminal of one of two electrical components to be opposed to each other;
disposing a terminal of another one of the two electrical components on the adhesive layer; and
curing the adhesive layer by heating the adhesive layer and irradiating the adhesive layer with light while the one of the two electrical components opposed to each other is pressed against the other one of the two electrical components, whereby the two electrical components opposed to each other are electrically connected to each other, wherein
the adhesive layer is formed from the radical polymerizable adhesive composition according to claim 1, and
when the adhesive layer is cured, irradiation with the light causes the photoacid generator to generate an acid to thereby accelerate a thermal-radical polymerization reaction of the radical polymerizable adhesive composition, whereby the adhesive layer is cured.

6. The production method according to claim 5, wherein the thermal-radical polymerization initiator is an organic peroxide, and the photoacid generator is a sulfonium salt, an iodonium salt, or an iron-arene complex.

7. The production method according to claim 6, wherein the organic peroxide serving as the thermal-radical polymerization initiator is a peroxyester or a diacyl peroxide having a one-minute half-life temperature of 80 to 170° C. and a molecular weight of 180 to 1,000, and the photoacid generator is a triarylsulfonium salt.

8. The production method according to claim 5, wherein at least one of the electrical components is a component in which a metal terminal is formed on one side of a transparent substrate, and the adhesive layer is irradiated with light from the other side of the transparent substrate of the electrical component.

9. The production method according to claim 5, wherein after the adhesive layer is heated, the adhesive layer is irradiated with light.

10. A method of producing an electrical connection body, the production method comprising the steps of:
disposing an adhesive layer on a terminal of one of two electrical components to be opposed to each other;
disposing a terminal of another one of the two electrical components on the adhesive layer; and
curing the adhesive layer by heating the adhesive layer and irradiating the adhesive layer with light while the one of the two electrical components opposed to each other is pressed against the other one of the two electrical components, whereby the two electrical components opposed to each other are electrically connected, wherein
the adhesive layer is formed from the radical polymerizable adhesive composition according to claim 1, and
the adhesive layer is heated at a temperature lower than a thermal-radical polymerization reaction temperature of a control radical polymerizable composition that corresponds to a composition obtained by removing the photoacid generator from the radical polymerizable adhesive composition.

* * * * *